(12) United States Patent
Azevedo et al.

(10) Patent No.: US 11,099,590 B2
(45) Date of Patent: Aug. 24, 2021

(54) INDIRECT LEAKAGE COMPENSATION FOR MULTI-STAGE AMPLIFIERS

(71) Applicant: Dialog Semiconductor (UK) Limited, London (GB)

(72) Inventors: Carlos Azevedo, Swindon (GB); Ambreesh Bhattad, Swindon (GB)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 16/826,183

(22) Filed: Mar. 21, 2020

(65) Prior Publication Data

US 2020/0310478 A1    Oct. 1, 2020

(30) Foreign Application Priority Data

Apr. 1, 2019   (DE) .......................... 102019204594.4

(51) Int. Cl.
*G05F 1/575* (2006.01)
*H03F 1/30* (2006.01)

(52) U.S. Cl.
CPC .............. *G05F 1/575* (2013.01); *H03F 1/301* (2013.01)

(58) Field of Classification Search
CPC . G05F 1/56; G05F 1/565; G05F 1/575; G05F 1/59; G05F 1/595; H03F 1/30;
(Continued)

(56) References Cited

U.S. PATENT DOCUMENTS 8,829,883 B2 *  9/2014  Samid .................. G05F 1/56
                                                    323/315
8,836,303 B2    9/2014  Napravnik et al.
(Continued)

FOREIGN PATENT DOCUMENTS

EP      2 648 061      9/2013
EP      2 952 996      9/2015
(Continued)

OTHER PUBLICATIONS

German Office Action, File No. 10 2019 204 594.4, Applicant: Dialog Semiconductor (UK) Limited, dated Nov. 12, 2019, 6 pages.

*Primary Examiner* — Matthew V Nguyen
(74) *Attorney, Agent, or Firm* — Salle Ackerman LLC; Stephen B. Ackerman

(57) ABSTRACT

A linear regulator with indirect leakage compensation is presented. The regulator has a pass device coupled between an input voltage and an output node, a feedback loop for controlling the pass device based on a reference voltage and a feedback voltage that depends on an output voltage, an off-state device that is kept in the off-state, and a leakage compensation circuit for sinking a leakage compensation current from the output node, in dependence on a leakage current of the off-state device. The off-state device is coupled between the leakage compensation circuit and an intermediate voltage level of the linear regulator. The intermediate voltage level is a voltage level between the input voltage level and ground, with a magnitude of the intermediate voltage level being smaller than a magnitude of the input voltage level. A corresponding method of operating a linear regulator with leakage compensation is presented.

22 Claims, 12 Drawing Sheets

(58) Field of Classification Search
CPC .......... H03F 1/301; H03F 1/305; H03F 1/343; H03F 1/345; H03F 4/45183; H03F 2203/45674

See application file for complete search history.

(56) References Cited

U.S. PATENT DOCUMENTS

| | | |
|---|---|---|
| 9,035,630 B2 | 5/2015 | Krenzke |
| 9,294,042 B2 * | 3/2016 | Scott .......................... H03F 1/30 |
| 10,156,862 B2 | 12/2018 | Krenzke |
| 2004/0130378 A1 | 7/2004 | Kihara |
| 2013/0265020 A1 * | 10/2013 | Krenzke ................... G05F 1/56 323/273 |
| 2015/0346750 A1 | 12/2015 | Bhattad |
| 2016/0018834 A1 | 1/2016 | Kronmueller et al. |
| 2016/0239038 A1 * | 8/2016 | Wang ...................... G05F 3/267 |
| 2017/0160758 A1 * | 6/2017 | Krenzke ................. G05F 1/575 |

FOREIGN PATENT DOCUMENTS

| | | |
|---|---|---|
| JP | 10-301642 | 11/1998 |
| JP | 3452459 | 9/2003 |

* cited by examiner

INDIRECT LEAKAGE COMPENSATION FOR MULTI-STAGE AMPLIFIERS

TECHNICAL FIELD

This disclosure relates to linear regulators (e.g., low dropout regulators (LDOs)) and to corresponding methods of operating linear regulators. The disclosure particularly relates to linear regulators with indirect leakage compensation.

BACKGROUND

As the process scales are further and further reduced and the demand for low quiescent current integrated circuits (ICs) increase, the leakage current of pass devices, especially at higher temperatures, becomes an important issue. This is particularly the case when it comes to high-performance or low IQ designs.

For any linear regulator (multi-stage amplifier) such as a LDO for example, the leakage current at no load condition (or low load condition) can interfere with the operation of the regulator. Namely, due to the size of the pass device, the leakage current may clamp the output voltage to the supply voltage (input voltage).

This means that it is mandatory to compensate for the leakage current since otherwise the regulator will either face stability problems at very small or no load currents or see its efficiency degraded. It is desirable that this compensation is achieved independently of temperature conditions.

SUMMARY

There is a need for improved linear regulators (multi-stage amplifiers) with leakage current compensation. There is particular need for linear regulators in which the leakage current compensation is temperature-independent. There is further need for corresponding methods of operating such linear regulators.

In view of some or all of these needs, the present disclosure proposes a linear regulator and a method of operating a linear regulator, having the features of the respective independent claims.

An aspect of the disclosure relates to a linear regulator. The linear regulator may include a pass device coupled between an input voltage level and an output node. The linear regulator may further include a feedback loop for controlling the pass device based on a reference voltage and a feedback voltage. The feedback voltage may depend on an output voltage at the output node. The linear regulator may include a feedback network for generating the feedback voltage. The feedback network may be a (variable) voltage divider circuit, for example. The linear regulator may further include an off-state device that is kept in the off-state. The off-state device may be a PMOS transistor or a NMOS transistor, for example. It may be kept in the off-state by coupling its gate terminal to its source terminal. The linear regulator may yet further include a leakage compensation circuit for sinking a leakage compensation current from the output node, in dependence on a leakage current of the off-state device. The leakage compensation current may compensate for a leakage current of the pass device, for example at a low load condition. The low load condition may be defined as a load condition in which the load current is of the same order of magnitude as the leakage current of the pass device, or smaller. The off-state device may be coupled between the leakage compensation circuit and an intermediate voltage level of the linear regulator. The intermediate voltage level may be an internal voltage level of the linear regulator. The intermediate voltage level may be a voltage level between the input voltage level and ground. Therein, a magnitude of the intermediate voltage level may be smaller than a magnitude of the input voltage level.

Configured as described above, by including the off-state device and the leakage compensation circuit, the leakage current of the pass device can be compensated for, even at very high temperatures. Due to the compensation, the linear regulator is capable of delivering a wide range of output loads with high efficiency, regardless of temperature. Moreover, the linear regulator features a very low quiescent current.

In some embodiments, the leakage compensation circuit may be adapted to generate the leakage compensation current by applying a gain to the leakage current of the off-state device. The gain may depend on the leakage current of the off-state device. That is, the gain may be non-linear. Accordingly, the leakage compensation current can be closely tailored to the compensation current that is actually required, and a waste of power for excessive compensation currents can be avoided, thereby ensuring high efficiency of the linear regulator.

In some embodiments, the gain is determined by a function that depends on the leakage current of the off-state device, a channel length of the pass device, and/or a channel length of the off-state device. The function may further depend on a voltage across the pass device.

In some embodiments, the intermediate voltage level may be a voltage level that depends on the feedback voltage. In other words, the intermediate voltage level may be defined/controlled by the feedback loop. Further, the intermediate voltage level may be substantially fixed for a given output voltage (e.g., may not be temperature dependent). Since the intermediate voltage level is decoupled from the input voltage and controlled by the feedback loop, it is substantially stable (contrary to the input voltage), which allows to appropriately design dimensions of the leakage compensation circuitry, thus avoiding a waste of power and increasing power efficiency.

In some embodiments, the off-state device may differ from the pass device in at least one of a transistor type and a channel length. For example, the off-state device may be a PMOS if the pass device is a NMOS, and vice versa. Since the gain that is applied to the leakage current of the off-state device is variable, any differences between the off-state device and the pass device can be accounted for by appropriate choice of the gain profile, thus allowing for additional design flexibility.

In some embodiments, the intermediate voltage level may be the output voltage. That is, the off-state device may be coupled between the output node and the leakage compensation circuit. The output voltage is substantially fixed, as it is controlled by the feedback loop.

In some embodiments, the feedback loop may include an operational amplifier for controlling the pass device. The operational amplifier may receive, at its inputs, the reference voltage and the feedback voltage. Then, the intermediate voltage level may be a common source voltage level of the operational amplifier. Alternatively, the intermediate voltage level may be decoupled from the input voltage level by a transistor device of the operational amplifier that is pre-biased or whose gate terminal is coupled to a gate terminal of the pass device. Also this voltage level is substantially fixed, as it is controlled by the feedback loop.

In some embodiments, the leakage compensation circuit may include a current mirror and a biased transistor device coupled in series with one of the transistor devices of the current mirror. The biased transistor device may act as a current source that limits the compensation current, especially if there is a mismatch between threshold voltages of the transistor devices of the current mirror. Thereby, an excessive leakage compensation current can be avoided even if there is a mismatch between the transistor devices of the current mirror.

Another aspect of the disclosure relates to a method of operating a linear regulator. The linear regulator may include a pass device coupled between an input voltage level and an output node. The linear regulator may further include a feedback loop for controlling the pass device based on a reference voltage and a feedback voltage that depends on an output voltage at the output node. The method may include providing an off-state device that is kept in the off-state. The method may further include sinking a leakage compensation current from the output node, in dependence on a leakage current of the off-state device. The leakage compensation current may be sunk from the output node by means of a leakage compensation circuit. The off-state device may be coupled between the leakage compensation circuit and an intermediate voltage level of the linear regulator. The intermediate voltage level may be a voltage level between the input voltage level and ground. Therein, a magnitude of the intermediate voltage level may be smaller than a magnitude of the input voltage level.

In some embodiments, the method may further include generating the leakage compensation current by applying a gain to the leakage current of the off-state device. The gain may depend on the leakage current of the off-state device.

In some embodiments the gain may be determined by a function that depends on the leakage current of the off-state device, a channel length of the pass device, and/or a channel length of the off-state device. The function may further depend on a voltage across the pass device.

In some embodiments, the intermediate voltage level may be a voltage level that depends on the feedback voltage.

In some embodiments, the off-state device may differ from the pass device in at least one of a transistor type and a channel length.

In some embodiments, the intermediate voltage level may be the output voltage.

In some embodiments, the feedback loop may include an operational amplifier for controlling the pass device. The operational amplifier may receive, at its inputs, the reference voltage and the feedback voltage. Then, the intermediate voltage level may be a common source voltage level of the operational amplifier. Alternatively, the intermediate voltage level may be decoupled from the input voltage level by a transistor device of the operational amplifier that is pre-biased or whose gate terminal is coupled to a gate terminal of the pass device.

In some embodiments, the method may further include providing the leakage compensation circuit for generating the leakage compensation current. The leakage compensation current may include a current mirror and a biased transistor device coupled in series with one of the transistor devices of the current mirror.

It will be appreciated that method steps and apparatus features may be interchanged in many ways. In particular, the details of the disclosed method can be implemented as an apparatus (circuit) adapted to execute some or all or the steps of the method, and vice versa, as the skilled person will appreciate. In particular, it is understood that methods according to the disclosure relate to methods of operating the circuits according to the above embodiments and variations thereof, and that respective statements made with regard to the circuits likewise apply to the corresponding methods.

It is also understood that in the present document, the term "couple" or "coupled" refers to elements being in electrical communication with each other, whether directly connected e.g., via wires, or in some other manner (e.g., indirectly). Notably, one example of being coupled is being connected.

BRIEF DESCRIPTION OF THE DRAWINGS

Example embodiments of the disclosure are explained below with reference to the accompanying drawings, wherein like reference numbers indicate like or similar elements, and wherein FIG. 1 schematically illustrates an example of a linear regulator.

DESCRIPTION

As indicated above, identical or like reference numbers in the disclosure indicate identical or like elements, and repeated description thereof may be omitted for reasons of conciseness.

In a multi-stage amplifier (linear regulator) such as, for example, a LDO, the supply voltage $V_{DD}$ (input voltage) and the output voltage $V_{OUT}$ can vary individually or simultaneously. This wide range of operating conditions can pose a problem when trying to compensate for the leakage current, since it is the worst case scenario that needs to be considered when designing a compensation circuit for the leakage current. This may be inefficient and moreover may deprive the user of any control of the leakage current that is being compensated. The present disclosure addresses this issue by adaptively adjusting the leakage compensation circuit in a controlled fashion.

Broadly speaking, linear regulators according to embodiments of the present disclosure include an off-state device (e.g., a MOSFET transistor, either a PMOS or an NMOS, depending on the implementation). The off-state device may be said to act to a leakage sensor. It is coupled (e.g., connected) to a fixed voltage level (e.g., fixed for a given output voltage). Linear regulators according to embodiments of the disclosure further include an adaptive leakage compensation circuit, and, optionally, a saturation current source to limit any mismatch variation (e.g., of threshold voltages) in the adaptive leakage compensation circuit.

By providing these elements, linear regulators according to embodiments of the disclosure can have higher efficiency and better control of the leakage current at any corner of the operating conditions.

Figure 1:
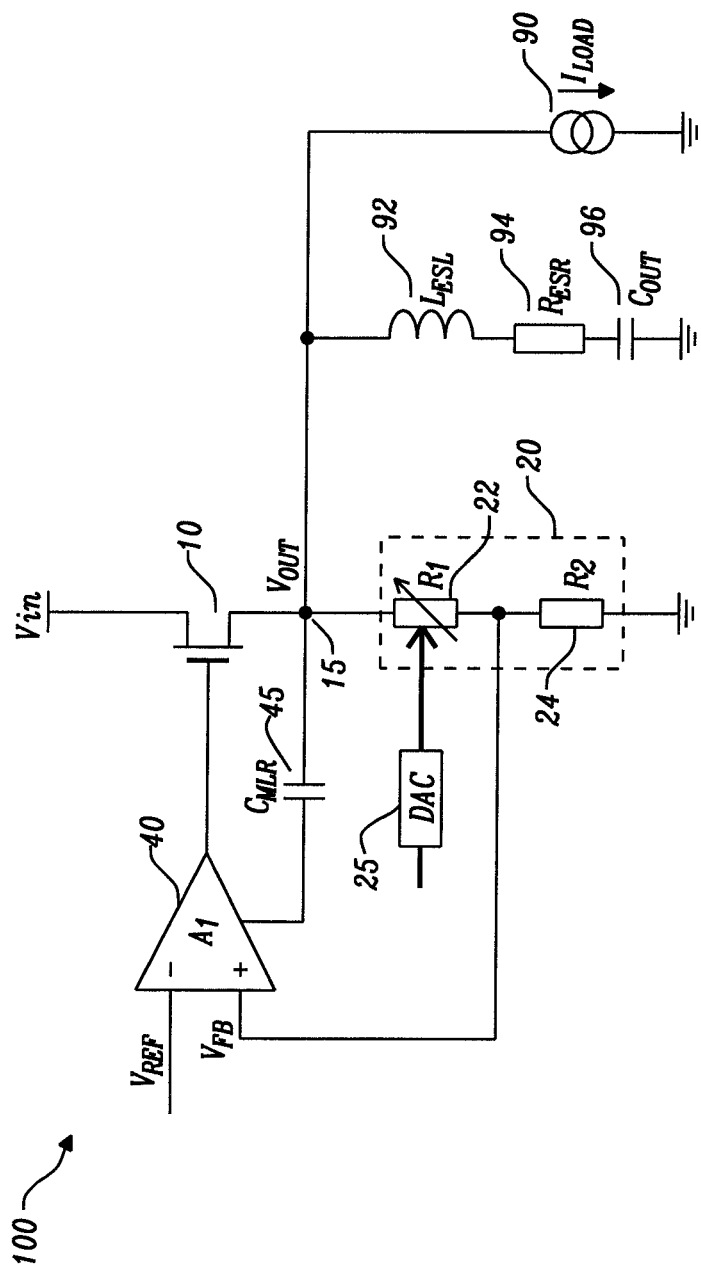

FIG. 1 schematically illustrates an example of a linear regulator 100 to which embodiments of the disclosure may be applied. In this example, without intended limitation, a multi-stage linear amplifier, and in particular, a PMOS implementation of a LDO is shown. The linear regulator 100 comprises a pass device 10, a feedback loop for controlling (a control terminal, e.g., gate, of) the pass device 10, and a feedback circuit (feedback network) 20 for generating a feedback voltage $V_{FB}$ for the feedback loop. The pass device 10 is coupled (e.g., connected) between an input voltage level $V_{DD}$ (e.g., at an input node of the linear regulator 100) and an output node 15 of the linear regulator 100. The output node 15 can be coupled to an output load 90.

The feedback loop controls the pass device 10 based on the feedback voltage $V_{FB}$ that depends on an output voltage $V_{OUT}$ at the output node 15 and reference voltage $V_{REF}$ (e.g., fixed reference voltage) for the feedback voltage $V_{FB}$. To this end, the feedback loop comprises an amplifier (e.g., operational amplifier) 40 for controlling the pass device 10. The amplifier 40 receives the feedback voltage $V_{FB}$ at one of its inputs (e.g., the non-inverting input) and receives the reference voltage $V_{REF}$ for the feedback voltage $V_{FB}$ at the other one of its inputs (e.g., the inverting input). An output of the amplifier 40 is coupled to the control terminal (e.g., gate) of the pass device 10.

The feedback voltage $V_{FB}$ is generated by the feedback circuit (feedback network) 20 to depend on the output voltage $V_{OUT}$ at the output node 15. The feedback circuit 20 may be a (variable) voltage divider circuit, for example. The voltage divider circuit may have a variable divider ratio (feedback ratio) K that determines the feedback voltage $V_{FB}$ in dependence on the output voltage $V_{OUT}$, via $V_{FB}=K \cdot V_{OUT}$. In the example of FIG. 1, the feedback circuit 20 is a programmable resistor string. The programmable resistor string comprises a string of at least two resistance elements 22, 24 (e.g., resistors). Among the resistance elements is a variable resistance element 22. The other resistance element(s) 24 may have fixed resistances. The variable resistance element 22 is arranged such that varying a resistance of the variable resistance element 22 changes the divider ratio K of the voltage divider circuit 20. For example, the feedback voltage $V_{FB}$ may be tapped at an intermediate node between the variable resistance element 22 and the other resistance element(s) 24. In this example implementation, decreasing the resistance of the variable resistance element 22 will increase the divider ratio K, whereas increasing the resistance will decrease the divider ratio K. The variable resistance element 22 (i.e., its resistance) may be controlled by a DAC 25 (e.g., an 8-bit DAC) that receives a digital control signal indicating a desired resistance of the variable resistance element 22. The digital control signal may be provided by a control block (not shown in the figure).

The linear regulator 100 further comprises an output capacitor 96 as well as an output inductor 92 and an output resistor 94.

Also shown in FIG. 1 is a Miller capacitance (Miller capacitor) 45 of the amplifier 40. The output voltage regulation in the linear regulator 100 proceeds by means of a negative feedback through the voltage divider circuit 20 (e.g., resistor string), which may be referred to as "slow-loop", and another feedback loop through the Miller capacitor 45, which may be referred to as "fast-loop".

Figure 2A:
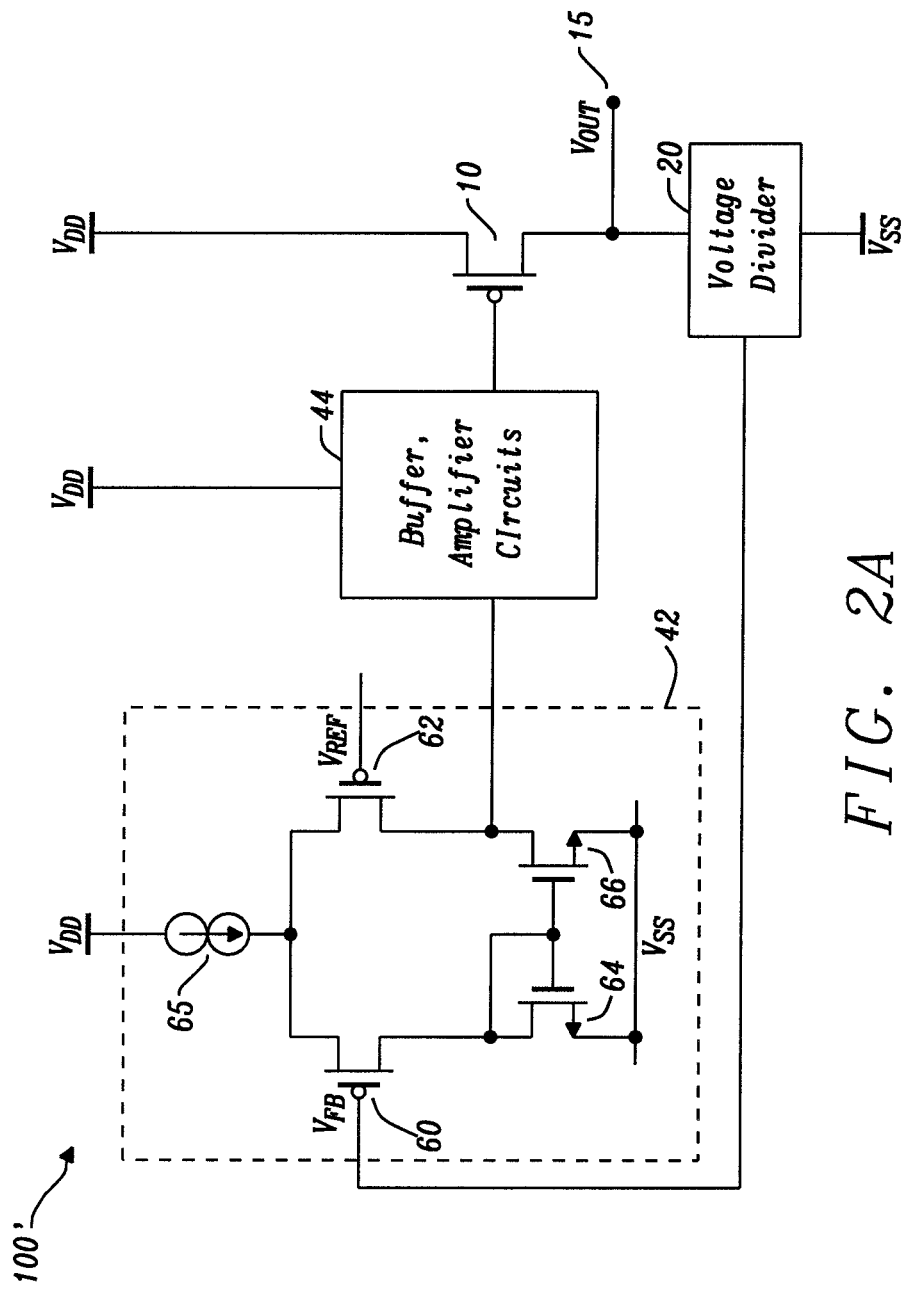
FIG. 2A schematically illustrates another example of a linear regulator.

The amplifier (e.g., operational amplifier 40) may be an amplifier with multiple stages, of which the first stage is an input stage (e.g., differential input stage) 42. This is shown in FIG. 2A, which schematically illustrates another example of a linear regulator 100'. The input stage 42 receives the feedback voltage $V_{FB}$ and the reference voltage $V_{REF}$ at its inputs. The input stage 42 may be a transconductance (gm) stage for converting a voltage differential at its inputs to a current at its output.

In the example of FIG. 2A, the input stage 42 of the amplifier 40 comprises a first transistor device 60 for receiving the feedback voltage $V_{FB}$ at its control terminal (e.g., gate) and a second transistor device 62 for receiving the reference voltage $V_{REF}$ at its control terminal (e.g., gate). The operational amplifier 40 further comprises third and fourth transistor devices 64, 66 that form a current mirror. The first and second transistor devices 60, 62 are coupled in parallel, each in series with a respective one of the third and fourth transistor devices 64, 66. The input stage 42 may be biased with a fixed current that is generated by a current source 65 coupled between the input voltage $V_{DD}$ and sources of the first and second transistor devices 60, 62.

The amplifier 40 may also comprise one or more further stages (e.g., buffer stages, amplifier stages), which are consolidated into circuit 44 in the example of FIG. 2A. Circuit 44 can be any piece of circuitry. The circuit 44 receives an output of the input stage 42 (e.g., the current produced by the input stage 42) at its input. An output of the circuit 44 is provided to the control terminal (e.g., gate) of the pass device 10 for controlling the pass device 10. One example of circuit 44 is an amplifier stage of the amplifier 40.

The output load 90, the output capacitor 96, the output inductor 92, and the output resistor 94 are not shown in the example of FIG. 2A, for reasons of simplicity and conciseness.

Figure 2B:
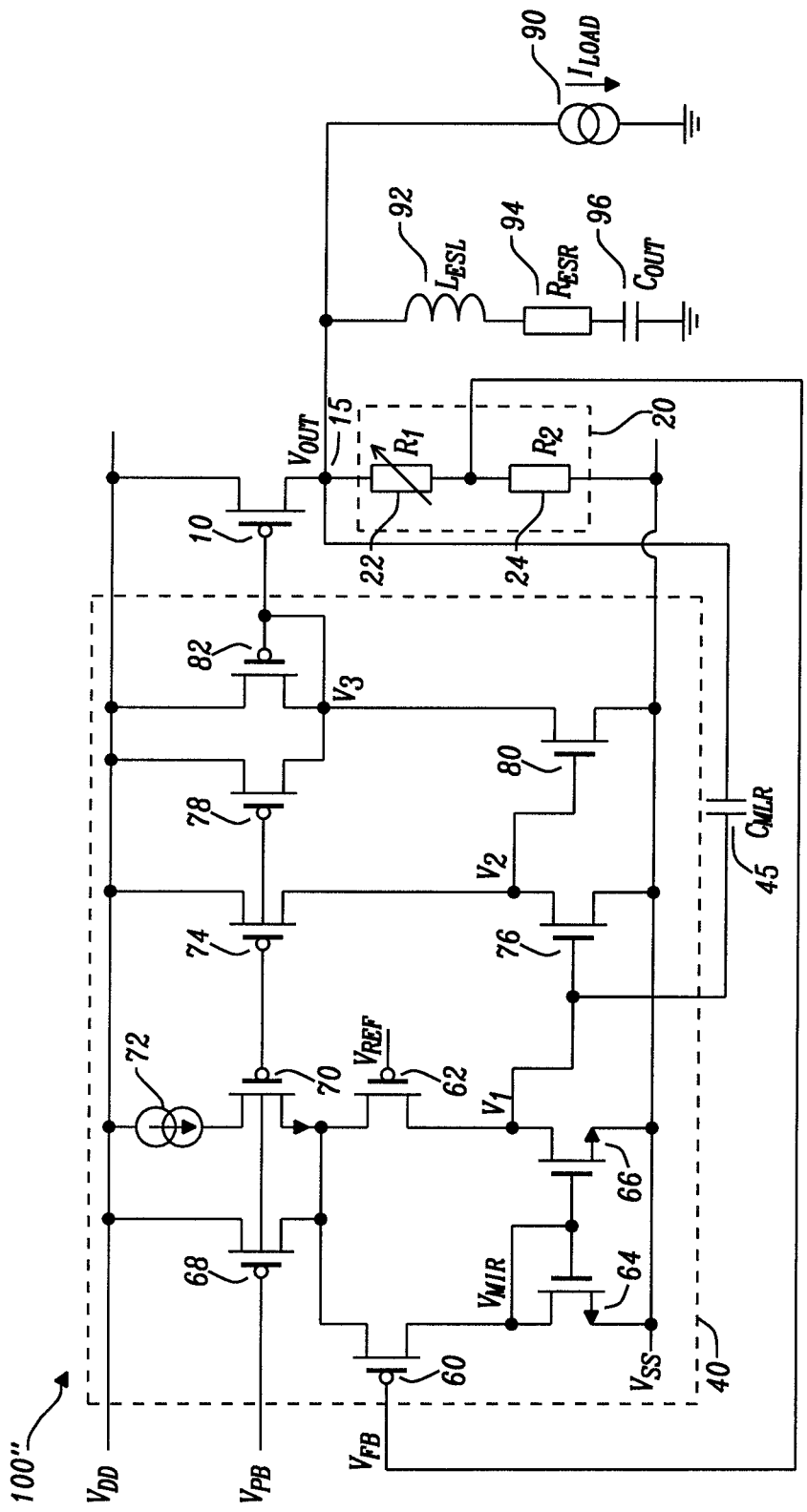
FIG. 2B schematically illustrates a transistor-level implementation of a linear regulator.

FIG. 2B shows an example of a linear regulator 100" that corresponds to a more detailed (i.e., transistor-level) view of the PMOS linear regulators 100, 100' of FIG. 1 and FIG. 2A. The linear regulator 100" differs from the linear regulators 100, 100' in that it shows an example of a transistor-level implementation of the amplifier 40. The other elements of linear regulator 100" may be identical to corresponding ones of linear regulators 100, 100' described above.

In particular, the linear regulator 100" of FIG. 2B relates to a 3-stage LDO, comprising a differential input stage 42, a common source amplifier biased with a fixed current, a buffer stage, and a pass device 10. However, many alternative implementations of the circuitry between the input stage 42 and the pass device 10 are feasible (as represented by circuit 44 in FIG. 2A) and the specific implementation of FIG. 2B is not to be construed in a limiting sense.

As in the linear regulator 100' of FIG. 2A, the operational amplifier 40 of the linear regulator 100" comprises the first transistor device 60 for receiving the feedback voltage $V_{FB}$ at its control terminal (e.g., gate) and the second transistor device 62 for receiving the reference voltage $V_{REF}$ at its control terminal (e.g., gate). The operational amplifier 40 further comprises the third and fourth transistor devices 64, 66 in a current mirror configuration. The first and second transistor devices 60, 62 are coupled in parallel, each in series with a respective one of the third and fourth transistor devices 64, 66.

The assembly of the first to fourth transistor devices 60, 62, 64, 66 is coupled in series with a fifth transistor device

68 between $V_{DD}$ and $V_{SS}$. That is, the common source of the first and second transistor devices 60, 62 may be coupled to the input voltage $V_{DD}$ via the fifth transistor device 68. A series connection of a sixth transistor device 70 and a current source 72 may be coupled in parallel to the fifth transistor device 68, between the input voltage $V_{DD}$ and said common source of the first and second transistor devices 60, 62. The sixth transistor device 70 and the current source 72 provide, via a saturation current of the sixth transistor device 70, a dynamic bias for limiting the feedback current.

Further, a string of a seventh transistor device 74 and an eight transistor device 76, and a string of a ninth transistor device 78 and a tenth transistor device 80 are coupled in parallel between $V_{DD}$ and $V_{SS}$. Control terminals (e.g., gates) of the seventh and ninth transistor devices 74, 78 are coupled to the control terminal of the fifth transistor device 68. These transistor devices may be pre-biased by a pre-bias voltage $V_{PB}$. An eleventh transistor device 82 is coupled in parallel to the ninth transistor device 78, with its control terminal (e.g., gate) coupled to an output terminal (e.g., drain in the present PMOS example) of the ninth transistor device 78. The control terminal of the eleventh transistor device 82 corresponds to the output of the operational amplifier 40 and is coupled to the control terminal of the pass device 10. The Miller capacitance 45 of the operational amplifier 40 is formed between the output node 15 of the linear regulator 100" and an intermediate node between the second and fourth transistor devices 62, 66. The first to fourth transistor devices 60, 62, 64, 66 (possibly together with the fifth transistor device 68, the sixth transistor device 70, and the current source 72) may correspond to (or form) the input stage 42 of the operational amplifier 40. The string of the eighth and ninth transistor devices 74, 76 may correspond to (or form) the amplifier stage 44 of the operational amplifier 40. The remaining transistor devices may be said to form a buffer stage (idrive stage), with a bleed current to keep the tenth transistor device 80 alive.

The generic PMOS LDOs shown in FIG. 1, FIG. 2A and FIG. 2B only have an active drive-up and rely on the load 90 to pull down. For some fields of application it may be desirable to have an active pull-down as well (e.g., using transistors, resistors, etc.).

Figure 3:
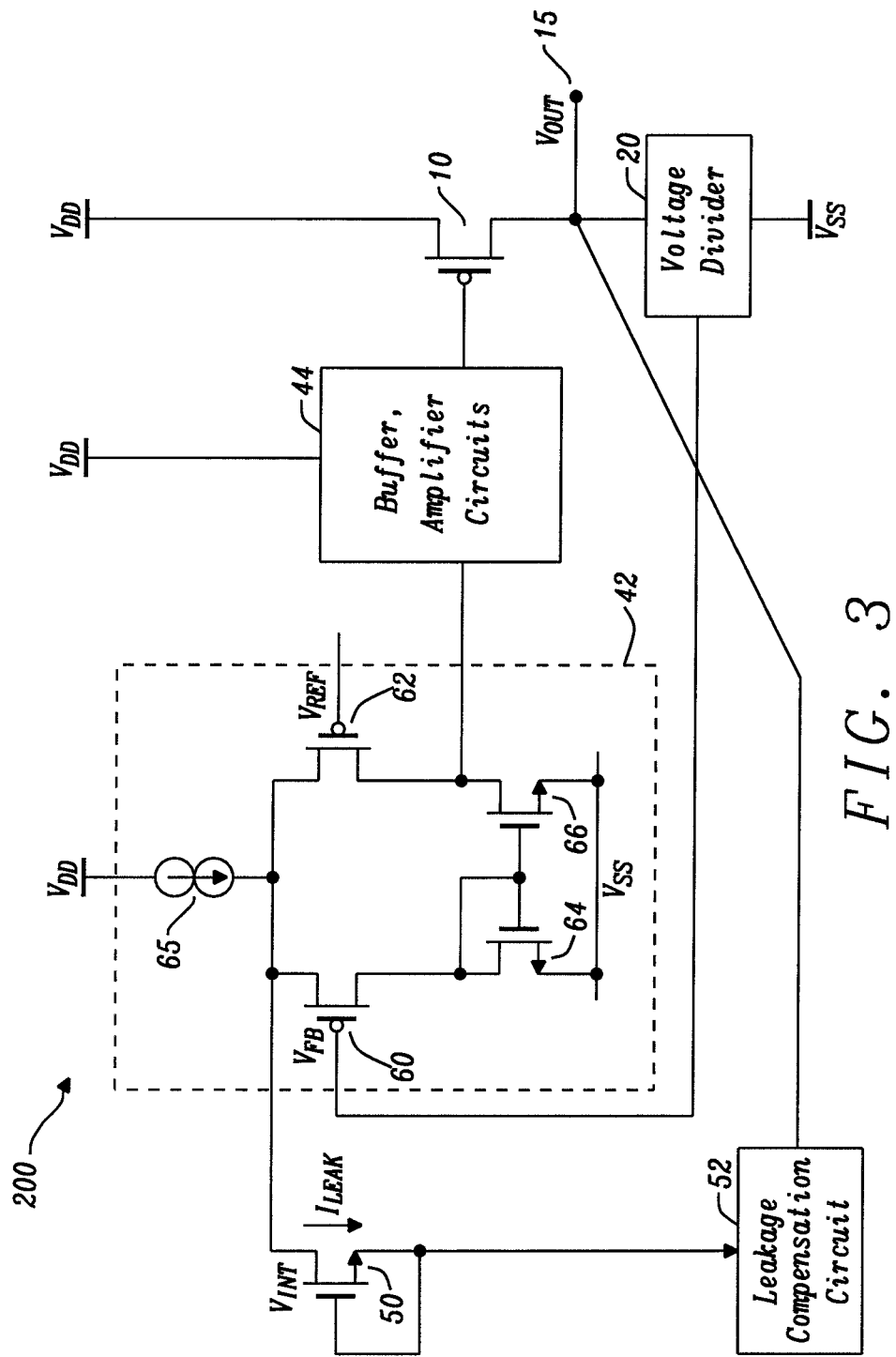
FIG. 3 schematically illustrates an example of a linear regulator according to embodiments of the disclosure.

FIG. 3 shows a linear regulator 200 according to embodiments of the disclosure. It corresponds to the linear regulator 100' of FIG. 2A, apart from that the linear regulator 200 additionally includes an off-state device (off-state transistor device) 50 and a leakage compensation circuit 52. It is understood that the off-state device 50 and the leakage compensation circuit 52 can be likewise applied to the linear regulators 100, 100".

The off-state device 50 may be a MOSFET, such as a PMOS or an NMOS, for example, and operates in the off-state (off-region). It may be kept in the off-state by coupling (e.g., connecting, or shorting) its source to its gate. The off-state device 50 is coupled between an intermediate voltage level $V_{INT}$ of the linear regulator 200 and the leakage compensation circuit 52. In this configuration, a leakage current $I_{LEAK}$ of the off-state device 50 can flow into the leakage compensation circuit 52.

The off-state device 50 does not need to be matched to the pass device 10. That is, the pass device 10 and the off-state device 50 do not need to be of the same (transistor) type, nor do they have to have the same channel length. In general, the off-state device 50 is not matched to the pass device 10. As such, the off-state device 50 may differ from the pass device 10 in at least one (possibly both) of the transistor type and the channel length. To give an example, the off-state device 50 may be an NMOS if the pass device 10 is a PMOS, and vice versa.

The intermediate voltage level $V_{INT}$ may be an internal voltage level of the linear regulator 200. In particular, it may be a voltage level that is between the input voltage level $V_{DD}$ and ground ($V_{SS}$). Here, a magnitude of the intermediate voltage level $V_{INT}$ may be smaller than a magnitude of the input voltage $V_{DD}$, i.e., the intermediate voltage level $V_{INT}$ may be different from the input voltage $V_{DD}$. In other words, the intermediate voltage level $V_{INT}$ may be decoupled from the input voltage $V_{DD}$. Decoupling may be achieved for example by one or more transistor devices that are coupled between the intermediate voltage level $V_{INT}$ and the input voltage $V_{DD}$. Moreover, it may be a (substantially) fixed voltage level (i.e., (substantially) fixed for a given output voltage $V_{OUT}$) within the linear regulator 200.

In embodiments of the disclosure, the intermediate voltage level $V_{INT}$ is defined/controlled by the feedback loop. For example, the intermediate voltage level $V_{INT}$ may depend on the feedback voltage $V_{FB}$. Under these circumstances, the intermediate voltage level $V_{INT}$ does not change together with the input voltage $V_{DD}$. Moreover, it does not exhibit a temperature dependence, as the feedback loop will ensure that the intermediate voltage level $V_{INT}$ remains fixed (for a given output voltage $V_{OUT}$).

In the example of FIG. 3, without intended limitation, the intermediate voltage level $V_{INT}$ corresponds to a common source voltage of the input stage 42 of the amplifier 40.

The leakage compensation circuit 52 may be an adaptive leakage compensation circuit. It is coupled to the output node 15 for sinking a leakage compensation current $I_{LEAK\_COMP}$ from the output node 15. This leakage compensation current $I_{LEAK\_COMP}$ may compensate for a leakage current of the pass device 10, for example at a low load condition. The low load condition may be understood as a load condition under which the load current is at most of the same order of magnitude as the leakage current of the pass device 10. For example the low load condition may be a load condition in which the load current is smaller than the leakage current of the pass device 10.

According to embodiments of the disclosure, the leakage compensation current $I_{LEAK\_COMP}$ for compensating the leakage current of the pass device 10 depends on the leakage current $I_{LEAK}$ of the off-state device 50. To achieve this, the leakage compensation circuit 52 may generate the leakage compensation current by applying a gain to the leakage current $I_{LEAK}$ of the off-state device 50. This gain may be non-linear. In particular, the gain may depend on one or more quantities relating to process-voltage-temperature (PVT) conditions.

This means that the leakage compensation circuit 52 is an adaptive leakage compensation circuit, as indicated above. A possible implementation of the leakage compensation circuit can include a current mirror with an adaptive implementation. For example, a simple current mirror with an adaptable (variable, controllable) mirror ratio can been used.

Figure 4:
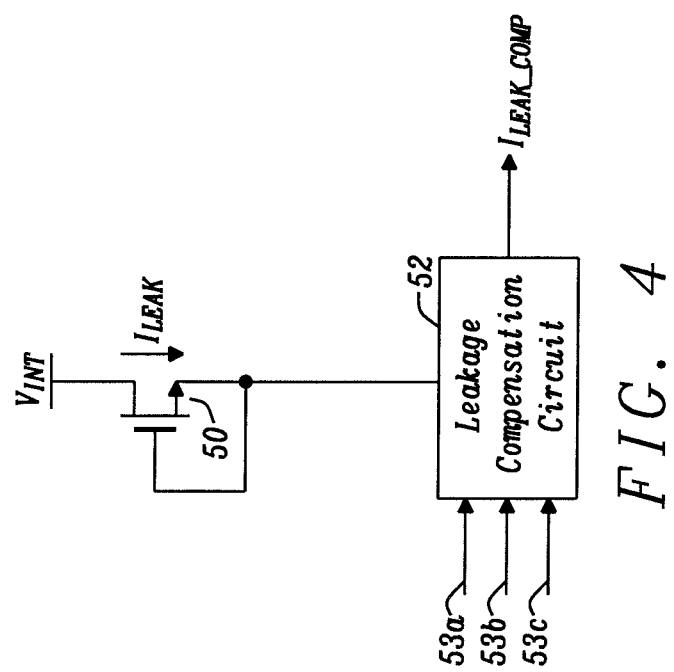
FIG. 4 schematically illustrates a detail of the linear regulator of FIG. 3.

FIG. 4 shows a detail of the linear regulator 200, in particular, the off-state device 50 and the leakage compensation circuit 52. As noted above, the aforementioned gain may depend on a number of quantities. This is schematically illustrated in the figure, in which quantities 53a, 53b, 53c are shown to impact operation of the leakage compensation circuit 52.

In some embodiments, the gain depends on the (magnitude of) the leakage current $I_{LEAK}$ of the off-state device 50. The gain may further depend on a voltage $V_{DS}$ across the pass device 10. The reason is that the voltage $V_{DS}$ across the pass device 10 can vary significantly, for example if the load is a battery that is discharging, or if the output voltage $V_{OUT}$ changes (e.g., due to changes in load demand). Considering, as a first operation point, high input voltage $V_{DD}$ and low output voltage $V_{OUT}$, the pass device 10 would see a big voltage across its terminals, meaning that the leakage current would be high. At a second operation point, low input voltage and low output voltage, the pass device 10 would have a smaller voltage across its terminals, implying a smaller leakage current. Without an adaptive leakage compensation circuit, the leakage compensation would be very inefficient and uncontrolled. This may, for example, degrade the battery life.

The gain may also depend on types and/or channel lengths of the pass device 10 and the off-state device 50. For example, the gain may be (determined by) a function of one or more (possibly all) of the leakage current $I_{LEAK}$ of the off-state device 50, the voltage $V_{DS}$ across the pass device 10, the channel length of the pass device 10 and/or the channel length of the off-state device 50. The gain (i.e., the function) may further depend on a type of the pass device 10 and/or a type of the off-state device 50.

During operation of the linear regulator 200, the types and channel lengths of the off-state device 50 and the pass device 10 are of course fixed. Then, the gain may be a predetermined function of the leakage current $I_{LEAK}$ of the off-state device 50 and/or the voltage $V_{DS}$ across the pass device 10. This function may have been determined offline based on one or more (possibly all) of the types and channel lengths of the off-state device 50 and the pass device 10.

To this end, the leakage compensation circuit 52 may receive an indication of the leakage current $I_{LEAK}$ of the off-state device 50 and/or an indication of the voltage $V_{DS}$ across the pass device 10 as control inputs. Further, the leakage compensation circuit 52 may comprise a control circuit (control block) that receives the control input(s) and adjusts the gain based on the predetermined function of the leakage current $I_{LEAK}$ of the off-state device 50 and/or the voltage $V_{DS}$ across the pass device 10. That is, the control circuit may adjust the gain based on the leakage current $I_{LEAK}$ of the off-state device 50 and/or the voltage $V_{DS}$ across the pass device 10, or example by (dynamically) adjusting a mirror ratio of a current mirror within the leakage compensation circuit 52. In some implementations, the control circuit may be provided separately from the leakage compensation circuit 52.

Figure 5:
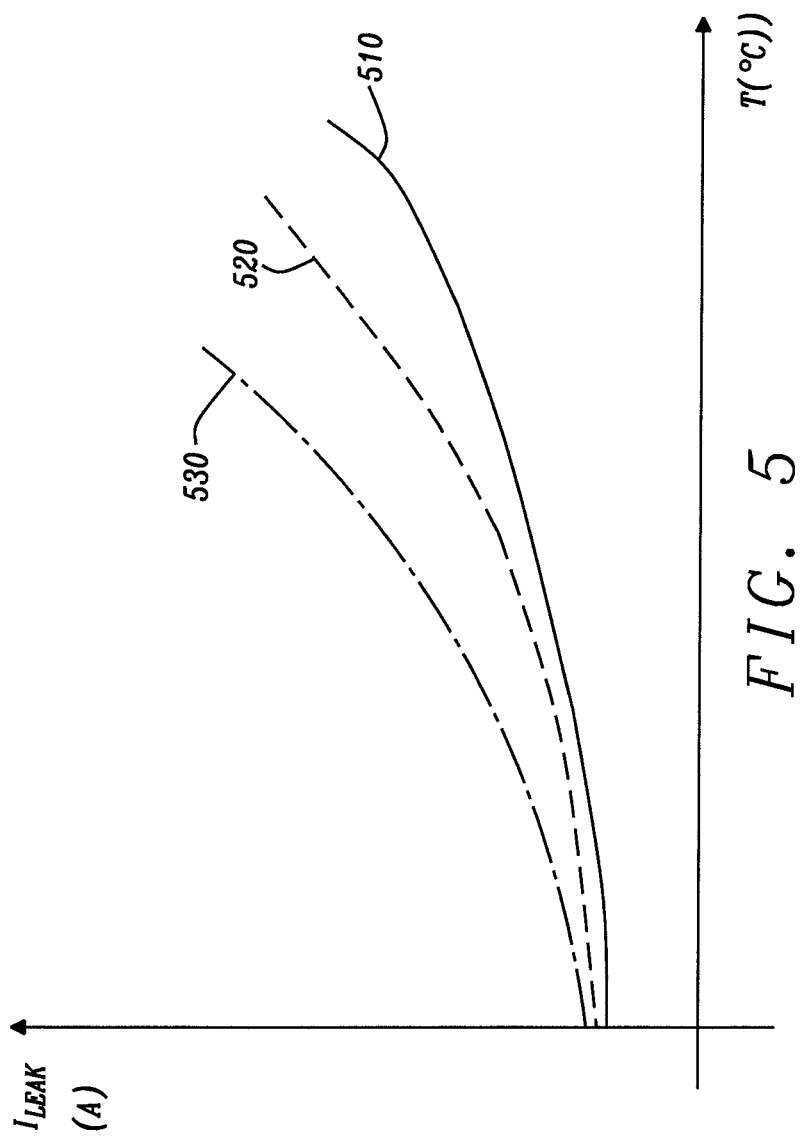
FIG. 5 is a graph schematically illustrating temperature profiles of leakage currents of transistor devices.

It is further understood that the gain is appropriately determined based on the leakage current characteristics (leakage current profiles) of the off-state device 50 and the pass device 10, respectively. These in turn depend on the types and channel lengths of the off-state device 50 and pass device 10, respectively. FIG. 5 shows examples of the leakage current profiles of the off-state device 50 and the pass device 10 as functions of temperature. The horizontal axis indicates temperature and the vertical axis indicates leakage current. Curve 510 indicates an example of the leakage current profile of the pass device 10, curve 520 indicates an example of the leakage current profile of the off-state device 50 if the off-state device 50 is a PMOS transistor device, and curve 530 indicates the leakage current profile of the off-state device 50 if the off-state device 50 is an NMOS transistor device.

If the leakage current profiles of the off-state device 50 and the pass device 10 are known beforehand (which is typically the case), the functional dependence of the gain on the leakage current $I_{LEAK}$ of the off-state device 50 and/or the voltage $V_{DS}$ across the pass device can be determined in such manner that the leakage compensation current $I_{LEAK\_COMP}$ that is generated by applying the gain to the leakage current $I_{LEAK}$ of the off-state device 50 is suitable for compensating the leakage current of the pass device 10. Typically, the leakage current profiles depend on the types and channel lengths of the respective transistor devices, which are known from respective process datasheets of the transistor devices.

Moreover, as can be seen from the above, if the gain is determined based on the leakage current profiles, it is not necessary that the off-state device 50 and the pass device 10 have the same channel lengths, and it is not even necessary that they are of the same type. Yet further, it is not necessary that the off-state device 50 is directly connected to the input voltage $V_{DD}$ (i.e., between the input voltage $V_{DD}$ and the leakage compensation circuit 52). In fact, it is sufficient if the off-state device 50 is coupled (e.g., connected) between the aforementioned intermediate voltage level $V_{INT}$ and the leakage compensation circuit 52.

As noted above, the leakage compensation circuit 52 may comprise a current mirror for applying the gain to the leakage current $I_{LEAK}$ of the off-state device 50. This current mirror may be operated in the saturation range. Any variant of a current mirror can be used as long as it has the necessary headroom to keep it in the saturation region.

Figure 6C:
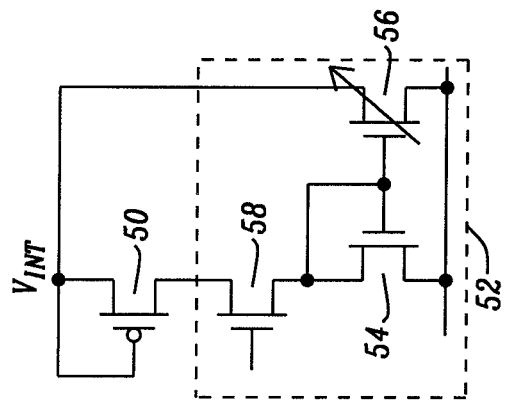
FIG. 6A, FIG. 6B, and FIG. 6C schematically illustrate examples of leakage compensation circuits according to embodiments of the disclosure.
Figure 6B:
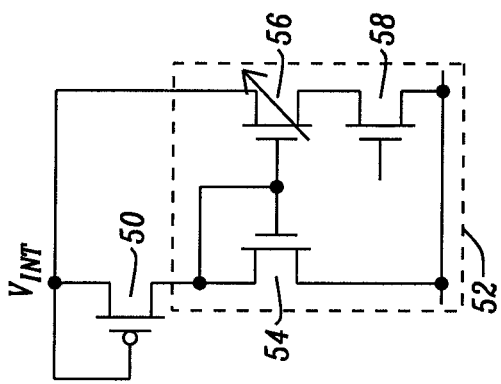
Figure 6A:
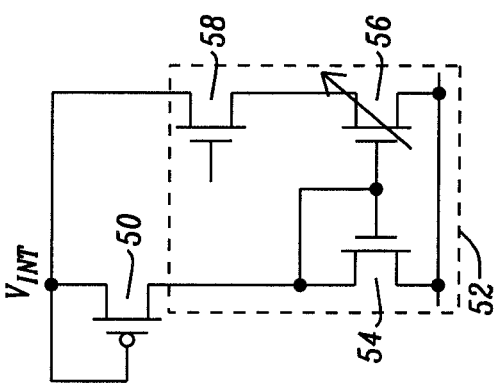

If mismatch between the transistor devices of the current mirror is a concern, a saturation current can be used to limit or precisely control the magnitude of the leakage compensation current $I_{LEAK\_COMP}$. To this end, the leakage compensation circuit 52 may comprise, in addition to the current mirror, a biased transistor device coupled in series with one of the transistor devices of the current mirror. This biased transistor device will act as a current source providing the saturation current. Examples of possible implementations involving a current mirror and a biased transistor device are schematically illustrated in FIG. 6A, FIG. 6B, and FIG. 6C.

In each implementation, the current mirror comprises an input-side transistor device 54 and an output side transistor device 56. One of the transistor devices, for example the output side transistor device 56, may have variable size. By varying the size of this transistor device, the mirror ratio of the current mirror can be changed, which will change the gain that is applied to the leakage current $I_{LEAK}$ of the off-state device 50. By appropriately (dynamically) adjusting the mirror ratio of this current mirror, any gain profile for the gain that is applied to the leakage current $I_{LEAK}$ of the off-state device 50 can be implemented. The size of the transistor device in question can be changed, for example, by selectively switching individual slices among a plurality of slices that make up the transistor device to the on-state.

The biased transistor device 58 can be coupled in series with either the input side transistor device 54 or the output side transistor device 56. In the example of FIG. 6A, the biased transistor device 58 is coupled in series with the output side transistor device 56, towards the input voltage side. In the example of FIG. 66, the biased transistor device 58 is coupled in series with the output side transistor device 56, towards ground. In the example of FIG. 6C, the biased transistor device 58 is coupled in series with the input side transistor device 54, between the input side transistor device 54 and the off-state device 50. Further arrangements of the biased transistor device 58 are feasible as well.

To supply the leakage current through the off-state device 50 and each leg of the differential pair (current mirror), it may be necessary to oversize the tail current of the differential or to let the dynamic bias feedback take care of this extra current necessary to provide the leakage current through the off-state device 50, without necessity to oversize the tail current of the differential pair. This can avoid an increased quiescent current.

Next, possible implementations of the intermediate voltage $V_{INT}$ and corresponding arrangements of the off-state device 50 will be described with reference to FIG. 7, FIG. 8, FIG. 9, and FIG. 10.

Figure 7:
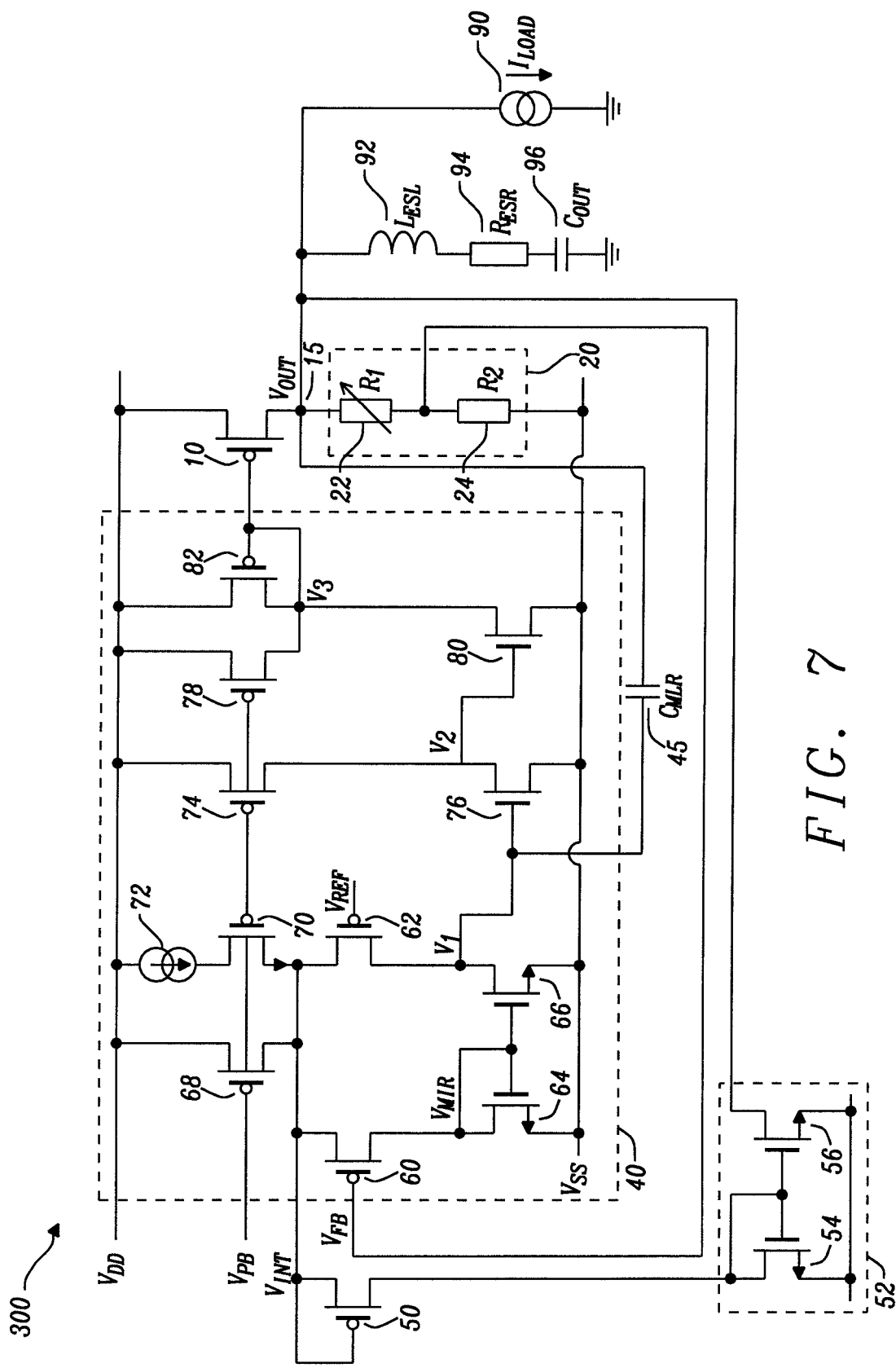
FIG. 7 to FIG. 10 schematically illustrate transistor-level implementations of further examples of linear regulators according to embodiments of the disclosure.

An example of a linear regulator 300 that relates to a first such implementation is schematically illustrated in FIG. 7. The linear regulator 300 corresponds to the linear regulator 100" in FIG. 2B, with the off-state device 50 and leakage compensation circuit 52 added. The leakage compensation circuit 52 is coupled to the output node 15 to compensate the leakage current of the pass device 10 by providing the leakage current $I_{LEAK\_COMP}$ to the output node 15 (i.e., by sinking the current from the output node 15). The off-state device 50 is coupled between the intermediate voltage $V_{INT}$ and the leakage compensation circuit 52. In this example, the intermediate voltage $V_{INT}$ is the common source voltage of the amplifier 40 (e.g., the common source voltage of the input stage 42 of the amplifier 40). That is, the off-state device 50 may be coupled between the sources of the first and second transistor devices 60, 62 and the leakage compensation circuit 52.

Figure 8:
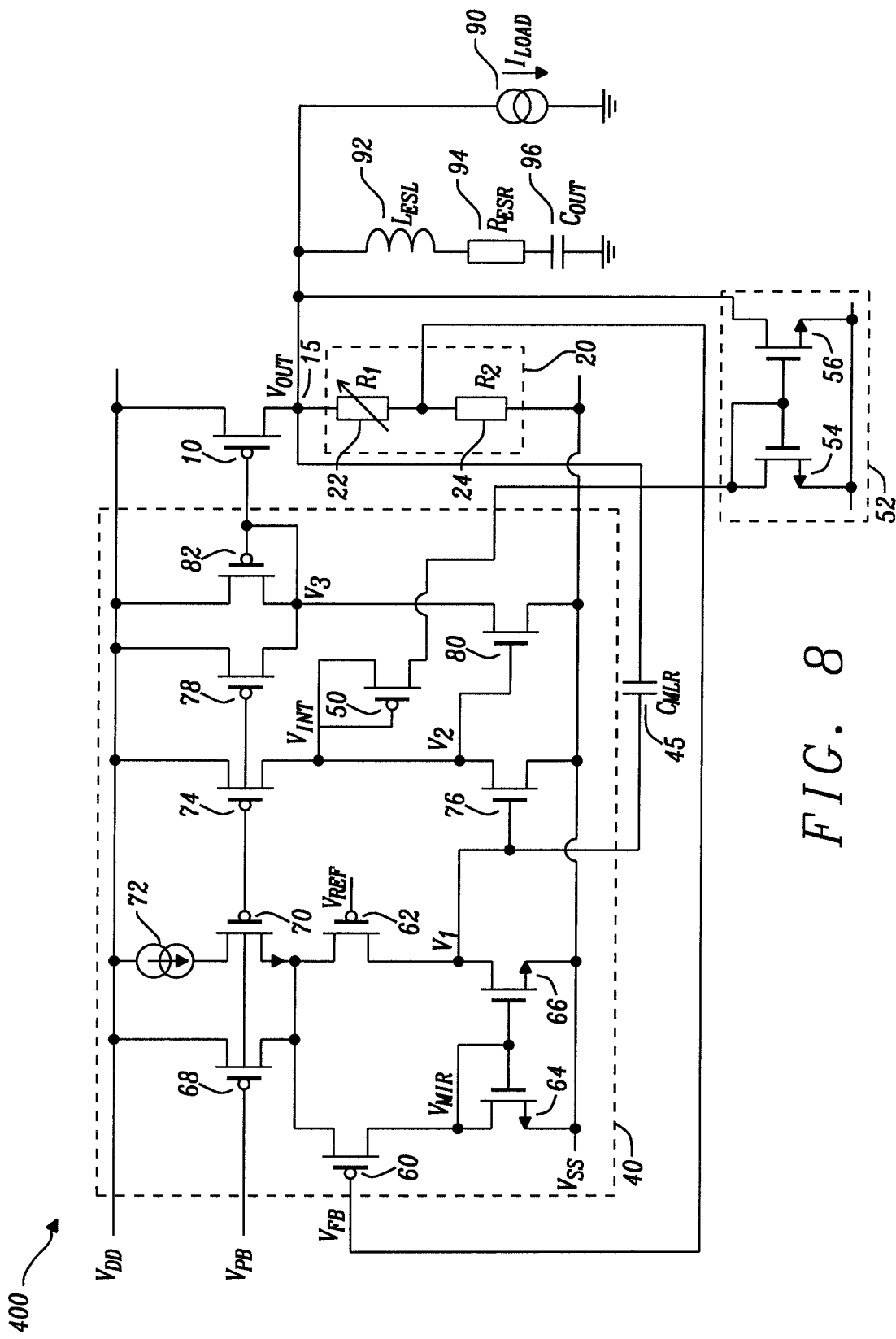

An example of a linear regulator 400 that relates to a second such implementation is schematically illustrated in FIG. 8. This time, the off-state device 50 is coupled between a voltage that is decoupled from the input voltage $V_{DD}$ by a transistor device (e.g., the seventh transistor device 74) that is pre-biased (e.g., by bias voltage $V_{PB}$) and the leakage compensation circuit 52.

Figure 9:
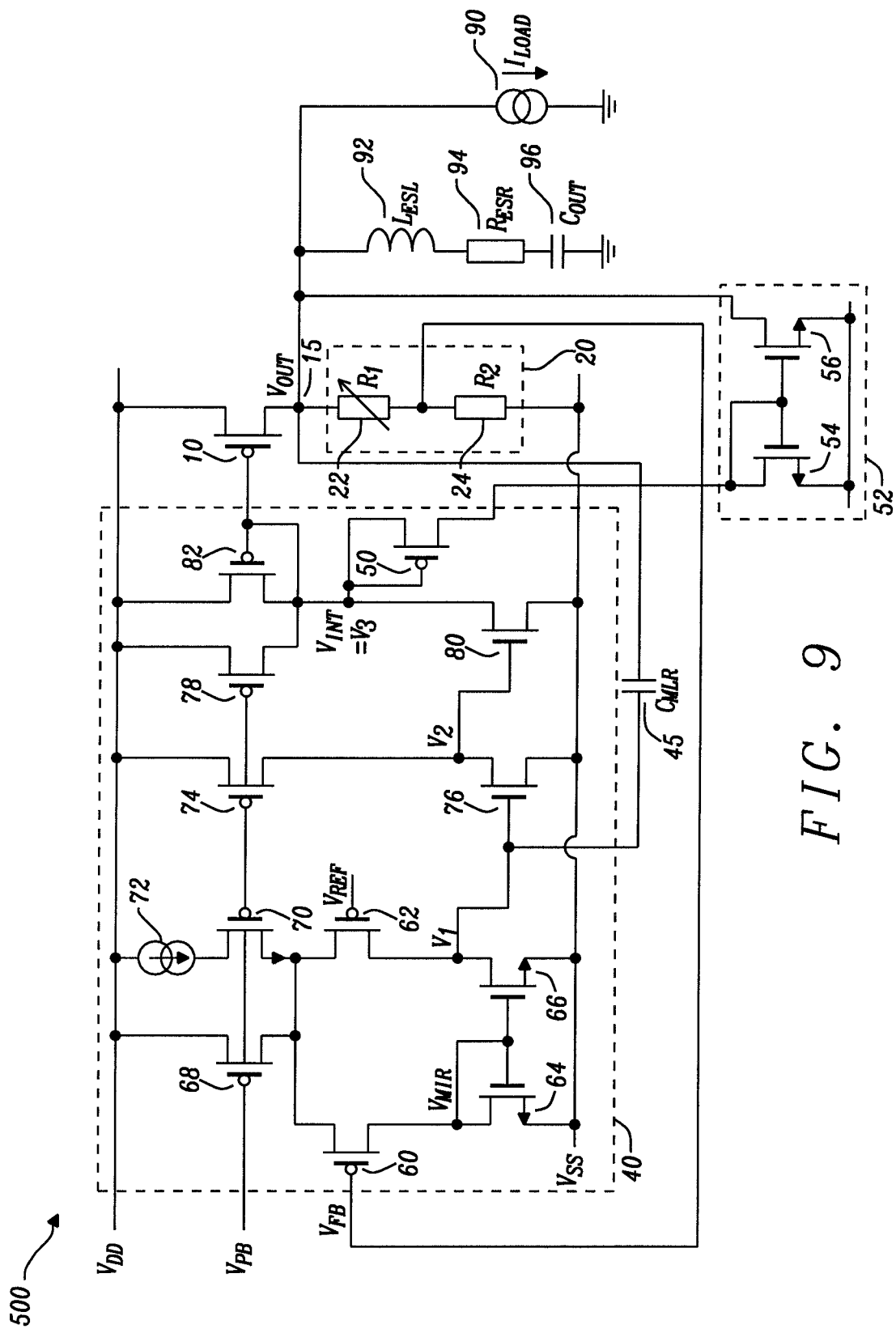

An example of a linear regulator 500 that relates to a third such implementation is schematically illustrated in FIG. 9. This time, the off-state device 50 is coupled between a voltage that is decoupled from the input voltage $V_{DD}$ by a transistor device (e.g., the eleventh transistor device 82) whose control terminal (e.g., gate) is coupled to the control terminal (e.g., gate) of the pass device 10, and the leakage compensation circuit 52.

Figure 10:
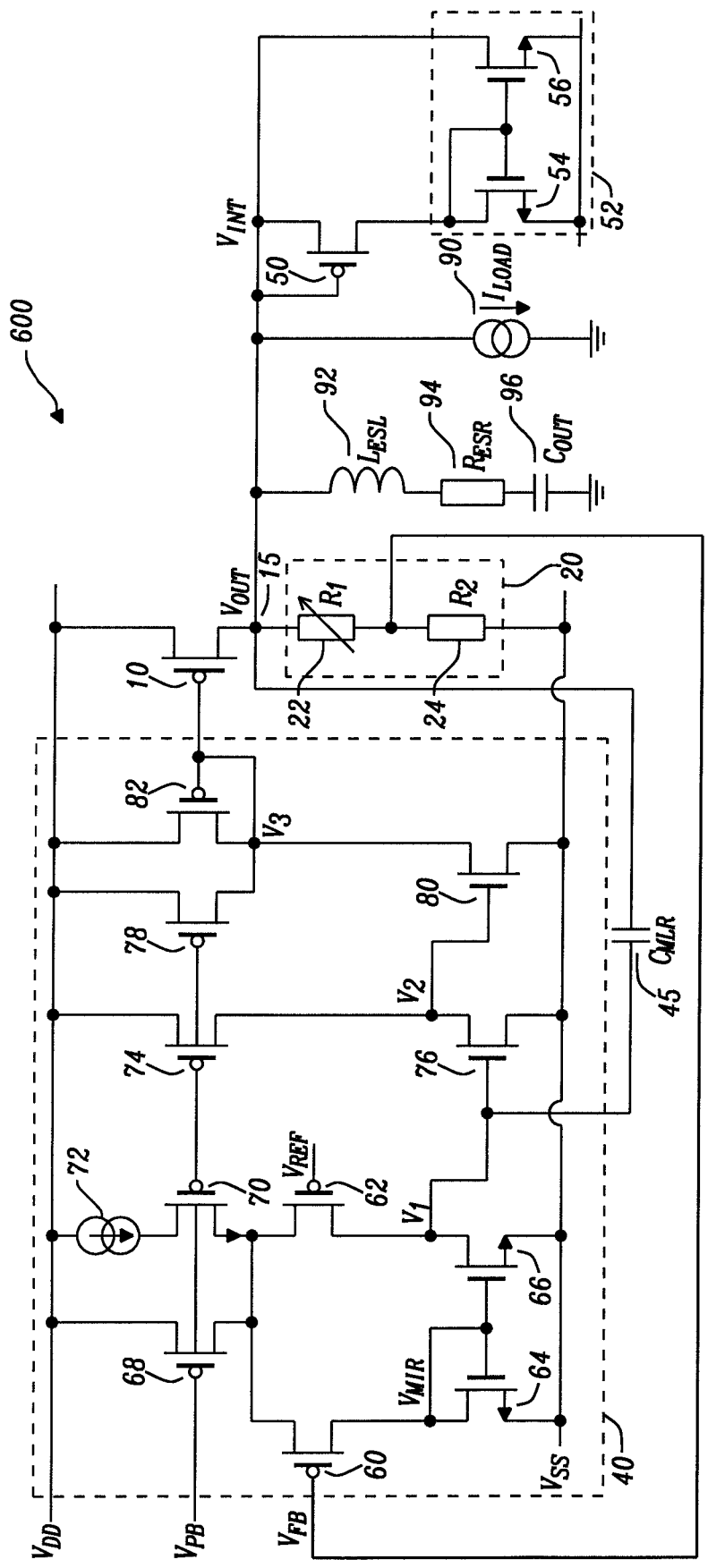

An example of a linear regulator 600 that relates to a fourth such implementation is schematically illustrated in FIG. 10. This time, the off-state device 50 is coupled between the output voltage $V_{OUT}$ (i.e., the output node 15) and the leakage compensation circuit 52.

Further implementations and arrangements of the off-state device 50 are feasible as well, as long as the intermediate voltage $V_{INT}$ satisfies the requirements set out above.

The basic principle of operation of linear regulators according to embodiments of the disclosure is as follows.

When working at the normal PVT corner, the off-state device 50 will be operating in the off-region allowing no current to flow from the common-source node of the differential stage (i.e., the leakage compensation circuit 52)—coming from the dynamic bias feedback structure, to the output. Once the temperature rises, for example to about 125° C., the off-state device 50 starts to conduct a small current which will be amplified by the current mirror (i.e., the leakage compensation circuit 52) to the output node 15, submitting the linear regulator (e.g., LDO) to some load. This current can be used to help the overall stability of the linear regulator since the current flowing in the buffer stage (idrive stage) of the amplifier 40 is a fraction of the output current which will push away the pole located on that node. If the process changes to the fast-fast (FF) corner, the leakage current of the pass device 10 is maximum. For a typical implementation of the linear regulator, the output pass device 10 may present a leakage current of about 7 μA at the FF corner at 125 C. With this in mind, the indirect leakage current compensation circuit (including the off-state device 50 and the leakage compensation circuit 52) according to embodiments of the disclosure may be sized in a way to load the output node 15 with a current (leakage compensation current $I_{LEAK\_COMP}$) slightly higher than the leakage current of the pass device 10 in order to keep the linear regulator to regulation.

Proper operation of the indirect leakage current compensation circuit (including the off-state device 50 and the leakage compensation circuit 52) according to embodiments of the disclosure has been verified in a number of simulations. Moreover, the linear regulator has been shown to be stable over PVT corners.

Figure 11:
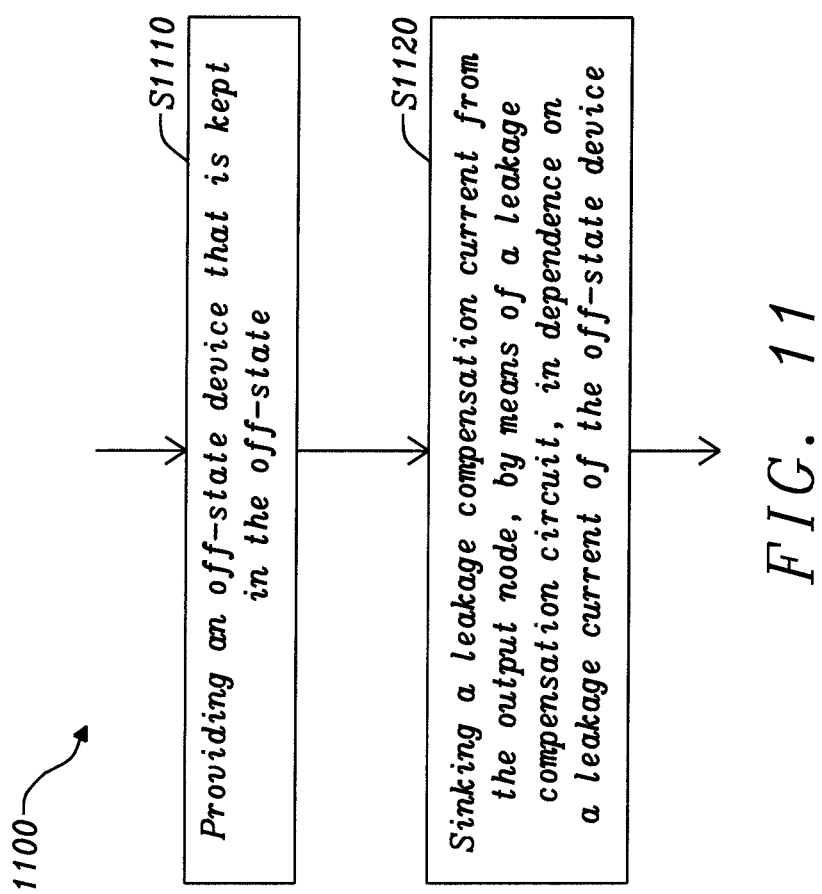
FIG. 11 illustrates, in flowchart from, an example of a method of operating linear regulators according to embodiments of the disclosure.

The present disclosure also relates to a corresponding method of controlling a linear regulator. The linear regulator may be configured as described above, i.e., it may comprise a pass device coupled between an input voltage level and an output node and a feedback loop for controlling the pass device based on a reference voltage and a feedback voltage that depends on an output voltage at the output node. An example of a method 1100 of operating such linear regulator is illustrated in FIG. 11 in flowchart form. The method 1100 comprises steps S1110 and S1120.

At step S1110, an off-state device that is kept in the off-state is provided. For example, this may be the off-state device 50 described above. At step S1120, a leakage compensation current is sunk from the output node, by means of a leakage compensation circuit, in dependence on a leakage current of the off-state device. The off-state device is coupled between the leakage compensation circuit and an intermediate voltage level of the linear regulator. This intermediate voltage level is a voltage level between the input voltage level and ground, with a magnitude of the intermediate voltage level being smaller than a magnitude of the input voltage level. For example, this may be the intermediate voltage level $V_{INT}$ described above.

Further details and implementations of the proposed method become apparent from the above description of linear regulators according to embodiments of the disclosure. It is understood that functionalities of the elements of the linear regulators described above readily translate into respective method steps of operating these linear regulators. Moreover, respective methods may include steps of providing the elements of corresponding linear regulators.

The present disclosure is generally applicable to any linear or switching converters such as multi-stage amplifiers, linear converters such as low-dropout regulators, switching converters such as buck converters, oscillators, etc. and can provide for leakage current compensation for these circuits. It is understood that the specific examples of the present disclosure relate to a LDO without intended limitation.

Notably, the figures discussed above illustrate or relate to PMOS implementations of the linear regulator. As the skilled person will appreciate, the circuits shown therein can be readily adapted to the case of an NMOS implementation of the linear regulator, with appropriate replacements of PMOS transistor devices by NMOS transistor devices, and vice versa, where necessary.

It should further be noted that the description and drawings merely illustrate the principles of the proposed circuits and methods. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed method. Furthermore, all statements herein providing principles, aspects, and embodiments of the invention, as well as specific examples thereof, are intended to encompass equivalents thereof.

What is claimed is:

1. A linear regulator, comprising:
a pass device coupled between an input voltage level and an output node;
a feedback loop for controlling the pass device based on a reference voltage and a feedback voltage that depends on an output voltage at the output node;
an off-state device that is kept in the off-state; and
a leakage compensation circuit for sinking a leakage compensation current from the output node, in dependence on a leakage current of the off-state device,
wherein the off-state device is coupled between the leakage compensation circuit and an intermediate voltage level of the linear regulator; and
wherein the intermediate voltage level is a voltage level between the input voltage level and ground, with a magnitude of the intermediate voltage level being smaller than a magnitude of the input voltage level.

2. The linear regulator according to claim 1, wherein the leakage compensation circuit is adapted to generate the leakage compensation current by applying a gain to the leakage current of the off-state device.

3. The linear regulator according to claim 2, wherein the gain depends on the leakage current of the off-state device.

4. The linear regulator according to claim 2, wherein the gain is determined by a function that depends on the leakage current of the off-state device, a channel length of the pass device, and a channel length of the off-state device.

5. The linear regulator according to claim 4, wherein the function further depends on a voltage across the pass device.

6. The linear regulator according to claim 1, wherein the intermediate voltage level is a voltage level that depends on the feedback voltage.

7. The linear regulator according to claim 1, wherein the off-state device differs from the pass device in at least one of a transistor type and a channel length.

8. The linear regulator according to claim 1, wherein the feedback loop comprises an operational amplifier for controlling the pass device, the operational amplifier receiving, at its inputs, the reference voltage and the feedback voltage; and
wherein the intermediate voltage level is a common source voltage level of the operational amplifier.

9. The linear regulator according to claim 1, wherein the feedback loop comprises an operational amplifier for controlling the pass device, the operational amplifier receiving, at its inputs, the reference voltage and the feedback voltage; and
wherein the intermediate voltage level is decoupled from the input voltage level by a transistor device of the operational amplifier that is pre-biased or whose gate terminal is coupled to a gate terminal of the pass device.

10. The linear regulator according to claim 1, wherein the intermediate voltage level is the output voltage.

11. The linear regulator according to claim 1, wherein the leakage compensation circuit comprises a current mirror and a biased transistor device coupled in series with one of the transistor devices of the current mirror.

12. A method of operating a linear regulator, wherein the linear regulator comprises:
a pass device coupled between an input voltage level and an output node; and
a feedback loop for controlling the pass device based on a reference voltage and a feedback voltage that depends on an output voltage at the output node,
the method comprising:
providing an off-state device that is kept in the off-state; and
sinking a leakage compensation current from the output node, by means of a leakage compensation circuit, in dependence on a leakage current of the off-state device,
wherein the off-state device is coupled between the leakage compensation circuit and an intermediate voltage level of the linear regulator; and
wherein the intermediate voltage level is a voltage level between the input voltage level and ground, with a magnitude of the intermediate voltage level being smaller than a magnitude of the input voltage level.

13. The method according to claim 12, further comprising:
generating the leakage compensation current by applying a gain to the leakage current of the off-state device.

14. The method according to claim 13, wherein the gain depends on the leakage current of the off-state device.

15. The method according to claim 13, wherein the gain is determined by a function that depends on the leakage current of the off-state device, a channel length of the pass device, and a channel length of the off-state device.

16. The method according to claim 15, wherein the function further depends on a voltage across the pass device.

17. The method according to claim 12, wherein the intermediate voltage level is a voltage level that depends on the feedback voltage.

18. The method according to claim 12, wherein the off-state device differs from the pass device in at least one of a transistor type and a channel length.

19. The method according to claim 12, wherein the feedback loop comprises an operational amplifier for controlling the pass device, the operational amplifier receiving, at its inputs, the reference voltage and the feedback voltage; and
wherein the intermediate voltage level is a common source voltage level of the operational amplifier.

20. The method according to claim 12, wherein the feedback loop comprises an operational amplifier for controlling the pass device, the operational amplifier receiving, at its inputs, the reference voltage and the feedback voltage; and
wherein the intermediate voltage level is decoupled from the input voltage level by a transistor device of the operational amplifier that is pre-biased or whose gate terminal is coupled to a gate terminal of the pass device.

21. The method according to claim 12, wherein the intermediate voltage level is the output voltage.

22. The method according to claim 12, further comprising:
providing the leakage compensation circuit for generating the leakage compensation current,
wherein the leakage compensation current comprises a current mirror and a biased transistor device coupled in series with one of the transistor devices of the current mirror.

* * * * *